United States Patent [19]

Yamada

[11] 4,356,502

[45] Oct. 26, 1982

[54] PROTECTION CIRCUIT FOR A SEMICONDUCTOR DEVICE

[75] Inventor: Tetsuo Yamada, Yokohama, Japan

[73] Assignee: Tokyo Shibaura Denki Kabushiki Kaisha, Japan

[21] Appl. No.: 103,446

[22] Filed: Dec. 14, 1979

[30] Foreign Application Priority Data

Jan. 31, 1979 [JP] Japan .................................. 54-9191

[51] Int. Cl.³ ............................................. H01L 29/90
[52] U.S. Cl. ...................................... 357/13; 357/53;
357/24; 307/318; 323/231; 323/230; 357/23
[58] Field of Search ............ 357/23 R, 13, 24, 23 VT,
357/23 VD, 53; 323/230, 231; 307/318

[56] References Cited

U.S. PATENT DOCUMENTS 4,131,908 12/1978 Daub ..................................... 357/42

Primary Examiner—Martin H. Edlow
Attorney, Agent, or Firm—Finnegan, Henderson, Farabow, Garrett & Dunner

[57] ABSTRACT

A protection circuit for a semiconductor substrate comprises a semiconductor substrate of a first conductivity type, a first region of a second conductivity type formed in the semiconductor substrate, a second region of the first conductivity type formed in the first region, a means for applying a reverse bias to a PN junction formed between the semiconductor substrate and the first region and a PN junction formed to the first and second regions, and a wiring for electrically connecting the second region to the semiconductor device to be protected.

3 Claims, 4 Drawing Figures

PROTECTION CIRCUIT FOR A SEMICONDUCTOR DEVICE

BACKGROUND OF THE INVENTION

This invention relates to a semiconductor device and more particularly a protection circuit for a semiconductor device, such as a charge transfer device and solid-state image pickup device, in which a charge packet is transferred.

For example, a charge transfer device comprises a semiconductor substrate and a plurality of charge transfer electrodes formed on the major surface of the semiconductor substrate with an insulating layer therebetween. The charge transfer device is operated such that a charge packet is transferred in the semiconductor substrate by sequentially applying pulses in proper timings.

A conventional protection circuit as applied to, for example, a charge transfer device will be explained below.

The conventional protection circuit comprises a semiconductor substrate portion of a charge transfer device, a selected region formed in the major surface area of the semiconductor substrate portion and having a conductivity opposite to that of the semiconductor substrate and a wiring section for electrically connecting the selected region to transfer pulse input lines for charge transfer electrodes of the charge transfer device through an insulating layer formed on the major surface of the substrate. In order to additionally enhance protection efficiency, an auxiliary electrode is provided in the insulating layer formed at the major surface side of the semiconductor substrate.

The operation of the protection circuit will be explained below in connection with the operation of the charge transfer device.

Suppose that the charge transfer device is operated in a positive logic. The charge transfer device sequentially receives positive pulses of a predetermined magnitude at its transfer pulse input lines to permit a charge packet to be transferred in that portion of the substrate underlying the transfer electrode. When a positive transfer pulse of a predetermined level is applied, a PN junction between the substrate and the selected region is reverse biased to form a depletion layer at the PN junction. As a result, the pulse input line is substantially insulated from the substrate. For this reason, the charge transfer device is normally operated without possible breakage and thus no protective operation of the protection circuit is necessary.

Now suppose that, for example, a spike noise occurs and a high positive voltage, which may produce a breakdown between the transfer electrodes and/or between the transfer electrode and the substrate, i.e., a breakage of the charge transfer device, is applied to the transfer pulse input line. In this case, such a breakage is prevented by the operation of the protection circuit which will be later described.

When a high positive voltage is applied, an avalanche is produced at the PN junction between the substrate and the selected region and thus electric current starts to flow from the transfer pulse input line toward the substrate, thereby electrically connecting the input line to the substrate. As a result, a potential on the input line, i.e., a potential on the transfer electrode, is held to a potential on the substrate and a supply of a high positive voltage to the transfer electrode is avoided, thus preventing a possible breakdown between the transfer electrodes.

The auxiliary electrode is set to have a potential substantially the same as that of the substrate and serves to prevent a spread of a depletion layer at the PN junction between the substrate and the selected region. Therefore, the spread of the depletion layer at that portion of the PN junction closer to the auxiliary electrode is suppressed to a smaller extent and the intensity of an electric field at that place becomes greater, tending to produce an avalanche.

Suppose, for example, that the insulating layer between the auxiliary electrode and the substrate has a thickness of 1200 Å and the substrate has an average impurity concentration of $10^{15}/cm^3$. When in this case a voltage applied to the transfer pulse input line reaches 30 to 40 V, an avalanche will be produced.

In the conventional protection circuit a problem occurs when a negative voltage is applied. That is, when a negative voltage is applied to the transfer pulse input line, the PN junction between the substrate and the selected region is forward biased, thereby causing majority carriers in the selected region to be injected into the substrate. The majority carriers (minority carriers when viewed at the substrate side) are diffused in the substrate with the lapse of time and combined with the majority carriers in the substrate.

However, some of the injected carriers do not combine with the majority carriers in the substrate and may reach that portion of the substrate underlying the transfer electrode of the charge transfer device. Such carriers will act as a false charge packet, lowering the reliability of the output data of the transfer device. Thus, the smaller the distance between the selected region and the transfer electrode and the longer the service life of such injected carriers, the higher the percentage that the injected carriers reach, as a false charge packet, that portion of the substrate underlying the transfer electrode.

Considered from the standpoint of the accuracy of the charge transfer device, on the other hand, the longer the service life of the injected carriers, the higher the performance. Thus, there is a conflict between the reduction of false charge packets and the enhancement of the performance of the charge transfer device. For this reason, it would be impossible to make the service life of the injected carriers too long or too short. In order to maintain the performance of the charge transfer device at a certain level, it would be practically impossible to make the service life of the injected carriers too short, or it would be practically difficult to make at a zero level those injected carriers which reach that portion of the substrate underlying the transfer electrode. As a negative voltage is applied to the transfer pulse input line there are, for example, overshoot and undershoot voltages which develop at the rise and fall of a transfer pulse, respectively, to be inputted to each input line and a voltage induced from a mutual influence between the transfer pulses to be inputted to each input line.

SUMMARY OF THE INVENTION

It is accordingly the object of this invention to provide a protection circuit for a semiconductor device which can prevent a breakdown even if a high positive or negative voltage is applied to the semiconductor device and can prevent carriers injected into a substrate from appearing as a false charge packet when a negative voltage is applied.

According to this invention there is provided a protection circuit for a semiconductor device, comprising a semiconductor substrate of a first conductivity type, a first region of a second conductivity formed in the semiconductor substrate, a second region of the first conductivity type formed in the first region, means for applying a reverse bias to a PN junction formed between the semiconductor substrate and the first region and a PN junction formed between the first region and the second region, and means for electrically connecting the second region to an electrode of the semiconductor device to be protected.

PREFERRED EMBODIMENTS OF THIS INVENTION

Figure 1:
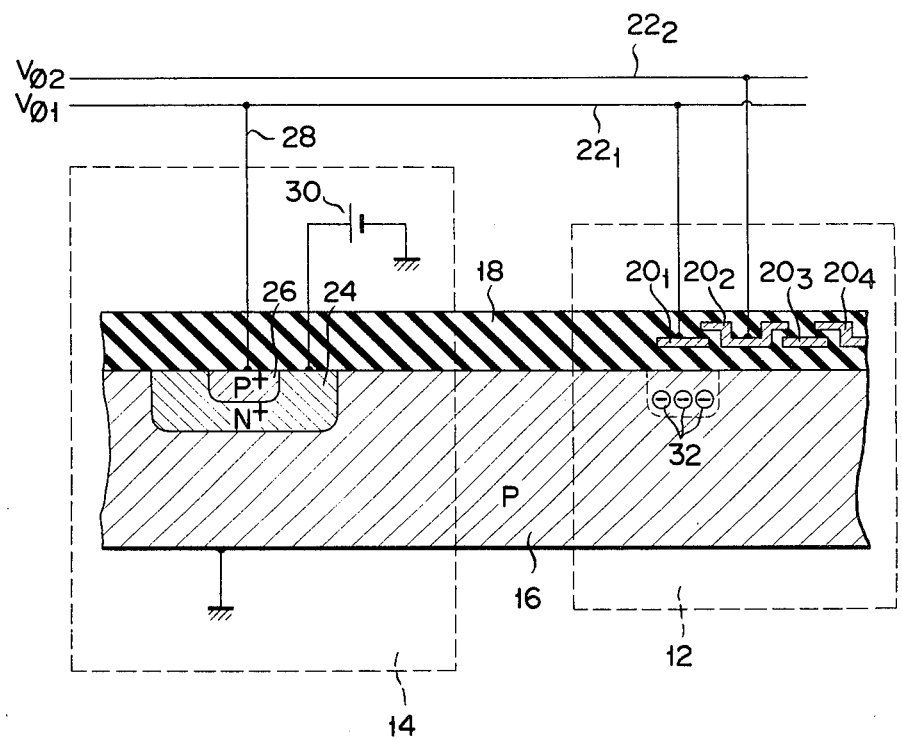
FIG. 1 is a cross-sectional view showing a protection circuit of this invention as applied to a charge transfer device.

FIG. 1 shows a protection circuit of this invention as applied to a charge transfer device. In FIG. 1 a block 12 indicated by a dotted line shows a charge transfer device section and a block 14 as indicated by another dotted line shows a protective circuit section. A p-type semiconductor substrate 16 is grounded and an insulating layer 18 is formed on the major surface of the substrate 16.

In the charge transfer device 12, an array of transfer electrodes $20_1, 20_2, 20_3, 20_4$ ... is formed in the insulating layer 18. For the sake of brevity only four transfer electrodes $20_1, 20_2, 20_3$ and $20_4$ are shown in FIG. 1. To the transfer electrodes $20_1, 20_2$ ... are connected transfer input lines to which transfer pulses $V_{\phi 1}, V_{\phi 2}$ ... are supplied. For brevity, only two input lines are shown in FIG. 1.

In the protection circuit 14, an N+ type selected region 24 having a high impurity concentration is formed in the major surface area of a p-type substrate 16. A p+ type selected region 26 is formed in the N+ type selected region 24. The p+ type region 26 is connected by a wiring 28 to pulse input lines $22_1$, ... A power supply ($V_{BS}$) 30 has its positive terminal connected to the N+ type region 24 and its negative terminal grounded. As a result, a PN junction between the substrate 16 and the N+ type region 24 and a PN junction between the P+ type region 26 and the N+ type region 24 are reverse biased. Electrons 32 are sequentially transferred, as a charge packet, in that portion of the substrate 16 underlying the transfer electrodes $20_1, 20_2$ ...

Figure 2:
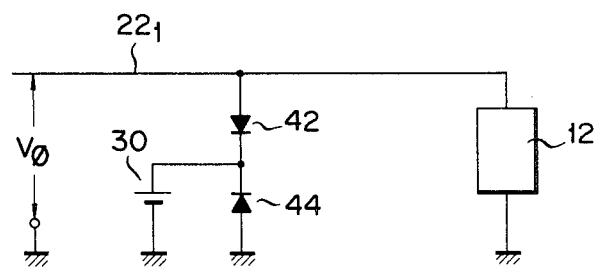
FIG. 2 is an equivalent circuit of the FIG. 1 circuit.

FIG. 2 shows an equivalent circuit of the FIG. 1 circuit. In this equivalent circuit, a diode 42 shows a PN junction diode formed between the P+ type region 26 and N+ type region 24 and a diode 44 shows a PN junction diode formed between the P type substrate 16 and the N+ type region 24. The block 12 is a general view showing the charge transfer device to be protected.

Figure 3:
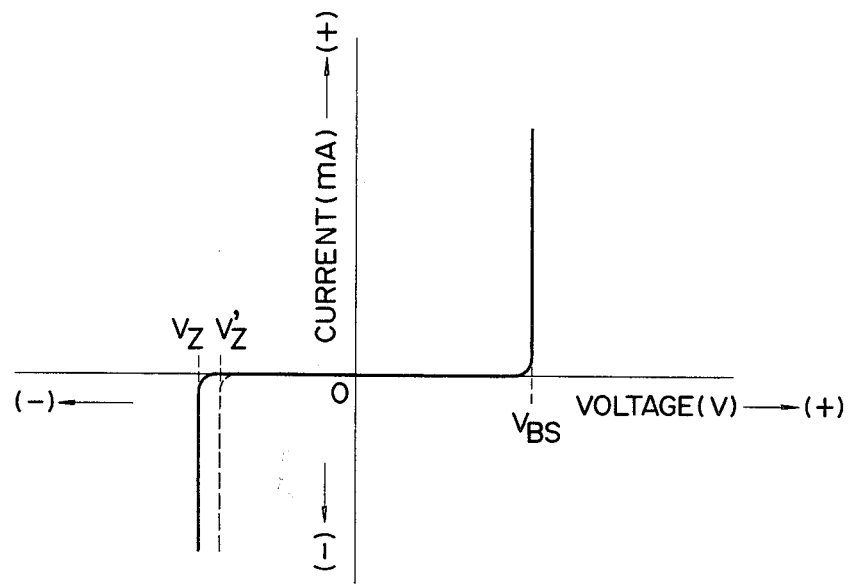
FIG. 3 is a curve diagram showing a voltage vs. current relation of a diode 42 in the equivalent circuit of FIG. 2.

FIG. 3 is a curve diagram showing a voltage vs. current relation of a diode 42 in the equivalent circuit of FIG. 2.

The operation of the protection circuit of this invention will be explained below in connection with the charge transfer device, while referring to FIGS. 1 to 3.

Now suppose that positive pulses $V_{\phi 1}, V_{\phi 2}, \ldots$ of predetermined levels are inputted to the transfer pulse input lines $22_1, 22_2$ such that they have a predetermined phase difference relation with respect to each other. Then, the charge packet 32 in FIG. 1 is sequentially transferred in that portion of the substrate 16 underlying the transfer electrodes $20_1, 20_2, 20_3, 20_4 \ldots$ In this way, the charge transfer device 12 normally performs its inherent function.

Let it be assumed that a high positive voltage resulting from a spike noise etc. is applied to the input line $22_1$. In this case, the diode 42 of the protection circuit 14 (in the equivalent circuit in FIG. 2), that is, the PN junction between the P+ type region 26 and N+ type region 24 is rendered ON and a potential on the line $22_1$ is suppressed substantially to the potential $V_{BS}$ (see FIG. 3) of the bias power supply 30. That is, a supply of a high voltage to the transfer electrode $20_1$ is prevented. By properly selecting the value of the voltage $V_{BS}$ a breakdown is prevented between the transfer electrodes $20_1, 20_2 \ldots$ Since the PN junction between the P type substrate 16 and the N+ region 24 is reverse biased by the bias power supply 30, a flow of electrons (charge packet) from the N+ type region 24 to the p-type substrate 16 does not occur.

Suppose that a negative voltage is applied. With "$-V_1$" representing a negative voltage value, a voltage "$V_{BS}+(-V_1)$" is applied to the PN junction between the P+ type region 26 and N+ type region 24, i.e., the diode 42 in the equivalent circuit. That is, the diode 42 is reverse biased by the voltage "$V_{BS}+(-V_1)$". When the negative voltage is small, a depletion layer of a proper width is formed between the p-type substrate 16 and the input line $20_1$ and thus the p-type substrate 16 and input line $20_1$ are insulated from each other.

If the negative voltage ($-V_1$) is relatively great, an avalanche occurs at the diode 42, i.e., the PN junction between the p+ type region 26 and the N+ type region 24 and a potential on the input line $22_1$ is suppressed to a breakdown voltage (see FIG. 3), i.e., an avalanche voltage. As a result, a supply of the high voltage $V_1$ to the transfer electrode is prevented and thus a breakdown is prevented between the transfer electrodes.

The above-mentioned protection circuit 14 is operated with respect to the semiconductor device 12 (the charge transfer device in this case) such that even if a high positive or negative voltage is applied no carrier injection into the substrate portion of the semiconductor device 12 occurs and thus the arrival at the charge transfer device 12 of a false charge packet is prevented.

Figure 4:
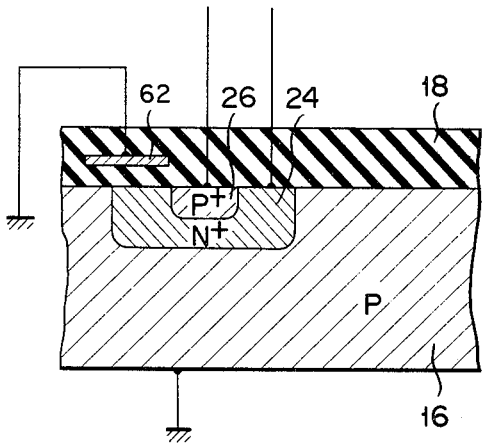
FIG. 4 is a cross-sectional view showing a protection circuit according to another embodiment of this invention.

FIG. 4 shows another embodiment of this invention.

In the arrangement of FIG. 4 that circuit portion similar to that of FIG. 1 is omitted for brevity. This embodiment is different from the FIG. 1 embodiment in that an auxiliary electrode 62 is provided in that portion of an insulating layer 18 closer to a p+ type region 26. The auxiliary electrode 62 narrows that portion of a depletion layer created between a p+ type region 26 and an N+ type region 24 which is closer to the auxiliary electrode 62, thus making it liable to produce an avalanche at a diode 42, i.e., at a PN junction between the region 24 and the region 26. By properly narrowing the depletion layer a breakdown voltage at which an avalanche occurs can be reduced to a Vz level as shown in FIG. 3. By varying a supply voltage to the auxiliary electrode 62 the proper narrowing of the depletion layer can be attained.

It is preferred that in order to narrow the depletion layer effectively, the auxiliary electrode 62 be disposed not only in a manner to wholly overlie the N+ type region 26, but also in a manner to extend above the p-type substrate.

As evident from the above, when a negative voltage is applied to the semiconductor device 12, the protection circuit 14 of this invention can prevent a breakage of the semiconductor device 12 as well as injection of carriers into the semiconductor device 12 which may be a major cause for entry of a false charge packet into the semiconductor device 12. For this reason, the protection circuit 14 of this invention is suitable for use as a protection circuit for a device, such as charge transfer device, solid-state image pickup device, which inhibits the injection thereinto of charges (electrons or holes) other than the charge packet.

As will be evident from the drawings, the protection circuit 14 of this invention is relatively simple in its construction and can be easily manufactured substantially according to the conventional transistor manufacturing process, i.e., without any complicated manufacturing process. Although the p-type substrate 16 is used in the abovementioned embodiment, an N-type substrate may of course be used. In this case, however, minority carriers in the substrate are holes and the p+ and N+ regions, 26 and 24, respectively, of the protection circuit 14 are replaced by N+ and P+ regions respectively.

No particular bias power supply is necessary. As such, a drain electrode may be used which is taken out of the drain of a MOS (metal oxide semiconductor) transistor in the output circuit of the semiconductor device. The ground potential as used in the above-mentioned embodiment may also be replaced by a reference potential.

What is claimed is:

1. A protection circuit for a semiconductor device formed in a common semiconductor chip with said circuit comprising:
   a semiconductor substrate of a first conductivity type;
   a first region of a second conductivity type formed in said semiconductor substrate;
   a second region of said first conductivity type formed in said first region;
   means for applying a constant potential to said first region to reverse bias a PN junction formed between said semiconductor substrate and said first region and to reverse bias a PN junction formed between said first and second regions; and
   means for electrically connecting said second region and said semiconductor device to be protected.

2. A protection circuit according to claim 1, further including:
   insulating means covering said substrate and said first and second regions; and
   an auxiliary electrode in said insulating means, partially overlying the surface of the first region of the second conductivity type.

3. A protection circuit according to claim 2 in which said auxiliary electrode extends above the semiconductor substrate.

* * * * *